(12) United States Patent
Chiang et al.

(10) Patent No.: US 10,014,283 B1
(45) Date of Patent: Jul. 3, 2018

(54) HIGH HEAT DISSIPATION STACKED CHIP PACKAGE STRUCTURE AND THE MANUFACTURE METHOD THEREOF

(71) Applicant: Jing Qiao Corporation Limited, Zhubei, Hsinchu County (TW)

(72) Inventors: Chin-Liang Chiang, Zhubei (TW); Neng-Huang Chu, Xinpu Township, Hsinchu County (TW); Yi-Lun Wu, Zhunan Township, Miaoli County (TW)

(73) Assignee: Jing Qiao Corporation Limited, Zhubei, Hsinchu County (TW)

( * ) Notice: Subject to any disclaimer, the term of this patent is extended or adjusted under 35 U.S.C. 154(b) by 0 days.

(21) Appl. No.: 15/782,239

(22) Filed: Oct. 12, 2017

(30) Foreign Application Priority Data

Aug. 10, 2017 (TW) .............................. 106127149 A

(51) Int. Cl.
| | |
|---|---|
| *H01L 25/065* | (2006.01) |
| *H01L 23/367* | (2006.01) |
| *H01L 21/48* | (2006.01) |
| *H01L 21/52* | (2006.01) |
| *H01L 21/56* | (2006.01) |
| *H01L 23/495* | (2006.01) |
| *H01L 23/522* | (2006.01) |

(Continued)

(52) U.S. Cl.
CPC ........ *H01L 25/0657* (2013.01); *H01L 21/486* (2013.01); *H01L 21/4846* (2013.01); *H01L 21/4853* (2013.01); *H01L 21/4882* (2013.01); *H01L 21/52* (2013.01); *H01L 21/563* (2013.01); *H01L 23/15* (2013.01); *H01L 23/367* (2013.01); *H01L 23/3677* (2013.01); *H01L 23/4952* (2013.01); *H01L 23/5226* (2013.01); *H01L 25/043* (2013.01); *H01L 25/0756* (2013.01); *H01L 25/117* (2013.01); *H01L 2021/603* (2013.01); *H01L 2021/60022* (2013.01); *H01L 2021/60277* (2013.01)

(58) Field of Classification Search
CPC ............ H01L 25/0657; H01L 25/0756; H01L 25/043; H01L 25/117; H01L 21/4846; H01L 21/4853; H01L 21/486; H01L 21/4882; H01L 2021/60022; H01L 2021/60277; H01L 2021/603; H01L 23/15; H01L 23/367; H01L 23/3677; H01L 23/4952; H01L 23/5226

See application file for complete search history.

(56) References Cited

U.S. PATENT DOCUMENTS

| | | | | |
|---|---|---|---|---|
| 5,869,894 A | * | 2/1999 | Degani | ............... H01L 23/5385 |
| | | | | 257/685 |
| 6,297,551 B1 | * | 10/2001 | Dudderar | .............. H01L 23/055 |
| | | | | 257/686 |

(Continued)

FOREIGN PATENT DOCUMENTS

| | | |
|---|---|---|
| CN | 101107710 A | 1/2008 |
| TW | 200810063 A | 2/2008 |

*Primary Examiner* — Marvin Payen
*Assistant Examiner* — Jeremy Joy
(74) *Attorney, Agent, or Firm* — Muncy, Geissler, Olds & Lowe, P.C.

(57) ABSTRACT

The present invention provides a semiconductor device including a first glass substrate, a first integrated chip, a first anisotropic conductive film, a second glass substrate, a second integrated chip, a second anisotropic conductive film, and a packaging body.

10 Claims, 8 Drawing Sheets

(51) Int. Cl.
*H01L 23/15* (2006.01)
*H01L 21/60* (2006.01)
*H01L 21/603* (2006.01)
H01L 25/04 (2014.01)
H01L 25/11 (2006.01)
H01L 25/075 (2006.01)

(56) References Cited

U.S. PATENT DOCUMENTS

| | | | | |
|---|---|---|---|---|
| 6,365,963 B1* | 4/2002 | Shimada | ............... | H01L 21/563 257/686 |
| 6,492,726 B1* | 12/2002 | Quek | ................... | H01L 23/055 257/723 |
| 8,531,019 B2* | 9/2013 | Onodera | ............... | H01L 25/105 257/676 |
| 2004/0135243 A1* | 7/2004 | Aoyagi | ............... | H01L 23/5385 257/686 |
| 2006/0016973 A1* | 1/2006 | Yang | ................... | H01L 31/0203 250/239 |
| 2008/0265436 A1* | 10/2008 | Kawabata | ............. | H01L 23/552 257/778 |
| 2009/0243065 A1* | 10/2009 | Sugino | .................... | H01L 23/16 257/686 |
| 2012/0104623 A1* | 5/2012 | Pagaila | ................... | H01L 23/13 257/774 |
| 2012/0228754 A1* | 9/2012 | Liu | ........................ | H01L 23/13 257/676 |
| 2015/0221571 A1* | 8/2015 | Chaparala | ............... | H01L 23/15 438/125 |
| 2015/0235990 A1* | 8/2015 | Cheng | .................... | H01L 25/50 257/712 |

* cited by examiner

HIGH HEAT DISSIPATION STACKED CHIP PACKAGE STRUCTURE AND THE MANUFACTURE METHOD THEREOF

CROSS-REFERENCE TO RELATED APPLICATIONS

This Non-provisional application claims priority under 35 U.S.C. § 119(a) on Patent Application No(s). 106127149 filed in Taiwan, Republic of China, on Aug. 10, 2017, the entire contents of which are hereby incorporated by reference.

FIELD OF THE INVENTION

The present invention relates to a semiconductor device, and in particular, relates to a package structure and the manufacture method for semiconductor devices where multiple integrated chips are stacked and high heat dissipation is achieved.

BACKGROUND OF THE INVENTION

Modern servers rely on multiple central processing units (CPUs) to meet the need for volume data processing and performance enhancement. Regardless how many processing units are adopted in a server, under current architecture, these processing units are distributedly disposed on the motherboard and connected through circuit layouts. Such architecture is problematic. First of all, each of the processing unit has numbers of pins connecting to the motherboard, and timing synchronization among these processing units is also a concern. Additionally, each of the processing units occupies a certain space of the motherboard. With the number of processing units adopted in the server increases, the size of the motherboard must be expanded as well. Those issues complicate the server's architecture design.

One of the conventional ways to solve the above issues is to package ICs, chips and/or dies in stacks. These methods are not without problem and the following are some examples.

The Chinese Pat. No. 101107710 describes a package for ICs with different sizes and functions stacked on a substrate. The size of the upper IC is larger than the size of the lower one, and the ICs are connected to the same substrate. The invention there describes that the resins must be prevented from flowing into the opening in the middle of the substrate, so that the light can pass through the opening. Similarly, the US Pat. Appl. No. US20060016973 also discloses a package where ICs with different sizes are connected to the same substrate and packaged; the middle of the substrate is opened for traversing light. Unlike the previous two, the opening portion taught in U.S. Pat. No. 8,531,019 is to dissipate the heat because its inwall is filled with metal wires and connected to a metal substrate and solder balls. In the U.S. Pat. No. 6,365,963, the package is provided for multiple ICs with various size and the opening is provided for connections. As for Taiwan Pat. No. TW200810063, the substrate is not made of glass, and the substrates therein are combined rather than separately connected to the packaging body. As evident from its FIG. 5(a), the structure may cause connection issues.

Apart from the aforementioned problems, these prior arts do not take into account the design of circuit layout. Given the drawbacks, the investor(s) of the present invention purpose a semiconductor device which not only resolves the circuit layout concern, but also increase the capacity of heat dissipation as well as decrease the overall packaging dimension.

SUMMARY OF THE INVENTION

In view of the foregoing issues, the invention presents a semiconductor device having a high degree of heat dissipation in which multiple integrated chips are stacked, and the manufacture of the same.

The semiconductor device of the invention includes: a first glass substrate having a first surface, a second surface, and a first via hole in the middle of the first glass substrate passing through the first surface and the second surface; a first substrate layout on the first surface having a plurality of first substrate connectors surrounding the first via hole and a plurality of first substrate conductive bumps deployed at the rim of the first glass substrate; a first integrated chip having a plurality of first device conductive bumps electrically connected to the first substrate connectors; a first anisotropic conductive film deployed around the first device conductive bumps and the first substrate connectors, and flowing into the first via hole; a second glass substrate having a third surface, a forth surface, and a second via hole in the middle of the second glass substrate passing through the third surface and the forth surface; a second substrate layout on the third surface having a plurality of second substrate connectors surrounding the second via hole and a plurality of second substrate conductive bumps deployed at the rim of the second glass substrate; a second integrated chip having a plurality of second device conductive bumps electrically connected to the second substrate connectors; a second anisotropic conductive film deployed around the second device conductive bumps and the second substrate connectors, and flowing into the second via hole; and a packaging body having a first body surface and a second body surface, wherein the first body surface further includes a trench and a main layout, the first integrated chip and the first glass substrate are deployed inside the trench and electronically connected to the main layout via the first substrate conductive bumps, and the second integrated chip and the second glass substrate are deployed above the first glass substrate and electronically connected to the main layout via the second substrate conductive bumps.

The method for manufacturing the semiconductor device of the present invention includes: providing a first glass substrate having a first surface and a second surface; forming a first substrate layout having a plurality of first substrate connectors and a plurality of first substrate conductive bumps at the rim of the first glass substrate on the first surface; forming a first via hole in the middle of the first glass substrate passing through the first surface and the second surface, wherein the first substrate connectors surround the first via hole; providing a first integrated chip having a plurality of first device conductive bumps; surrounding the first device conductive bumps and the first substrate connectors with a first anisotropic conductive film; heating and pressuring the first glass substrate, the first integrated chip and the first anisotropic conductive film so that the first device conductive bumps are electrically connected to the first substrate connectors, and the first anisotropic conductive film flows into the first via hole; providing a second glass substrate having a third surface and a forth surface; forming a second substrate layout having a plurality of second substrate connectors and a plurality of second substrate conductive bumps at the rim of the second glass substrate on the third surface; forming a second via hole in the middle of the second glass substrate passing through the third surface and the forth surface, wherein the second substrate connectors surround the second via hole; providing a second integrated chip having a plurality of second device conductive bumps; surrounding the second device conductive bumps and the second substrate connectors with a second anisotropic conductive film; heating and pressuring the second glass substrate, the second integrated chip and the second anisotropic conductive film so that the second device conductive bumps are electrically connected to the second substrate connectors, and the second anisotropic conductive film flows into the second via hole; providing a packaging body having a first body surface and a second body surface, wherein the first body surface further includes a trench and a main layout; deploying the first integrated chip and the first glass substrate inside the trench, and electrically connecting to the main layout through the first substrate conductive bumps; and deploying the second integrated chip and the first glass substrate above the first glass substrate, and electrically connecting to the main layout through the second substrate conductive bumps.

The present invention provides a semiconductor device and the method of manufacturing the same. According to the invention, each of the integrated chips is bonded to a glass substrate by way of chip-on-glass (COG), and the circuit layout is furnished on the glass substrate. The finished device (i.e. integrated chip bonded to a glass substrate) is stacked to another finish device and packaged together. A semiconductor device of such structure can lower the complexity of its circuit design and meanwhile diminish the dimension and size of the packaging. In conventional COG, anisotropic conductive films (ACF) are used to bond the chip and the glass substrate. However, if ACFs are not evenly diffused over the bonding face of the chip and the glass substrate or if bubbles thereon appear, the whole surface of the finished device can be bumpy. Such problem cannot be repaired by simply reconstructing the surface. The invention introduces a via hole formed in the middle of the glass substrate to solve the above issues. The excessive anisotropic conductive film will flow into the via hole and meanwhile enhances the heat dissipation.

Various aspects are now described with reference to the drawings. In the following description, for purposes of explanation, numerous specific details are set forth in order to provide a thorough understanding of one or more aspects. It may be evident, however, that the various aspects may be practiced without these specific details. In other instances, well-known structures and devices are shown in block diagram form in order to facilitate describing these aspects.

DETAILED DESCRIPTION OF THE INVENTION

In the following description, for purposes of explanation, numerous specific details are set forth in order to provide a thorough understanding of one or more aspects.

Figure 1:
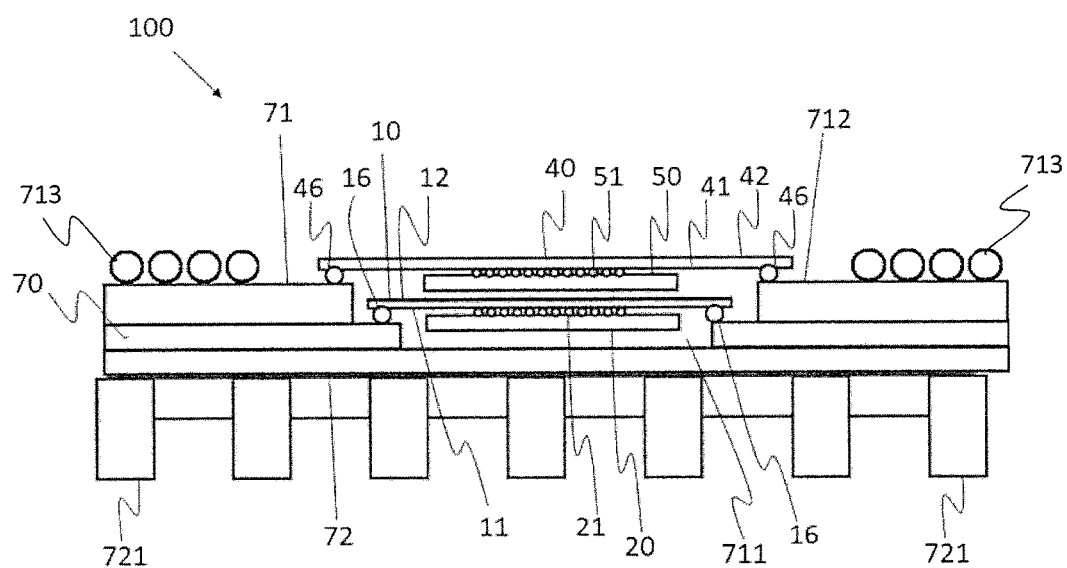
FIG. 1 illustrates a cross-section of a semiconductor device in accordance with the first embodiment of the present invention.
Figure 2:
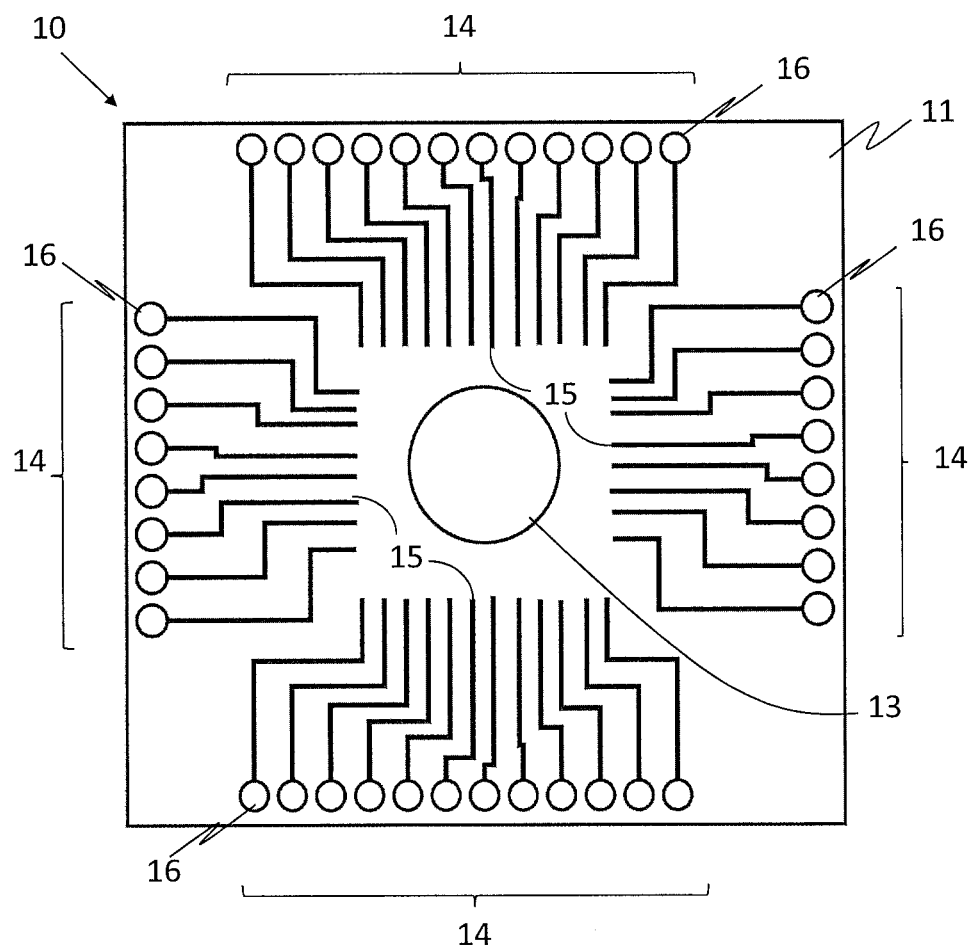
FIG. 2 shows a diagram of the first glass substrate of the semiconductor device in accordance with the present invention.

FIG. 1 illustrates a cross-section of a semiconductor device in accordance with the present invention; FIG. 2 shows a diagram of the first glass substrate of the semiconductor device. As illustrated, the invention provides a semiconductor device 100 having a first glass substrate 10. The first glass substrate 10 has a first surface 11, a second surface 12, and a first via hole 13 passing through the first surface 11. The first via hole 13 is formed in the middle of the first glass substrate 10. Additionally, there is a first substrate layout 14 deployed on the first surface 11. The first substrate layout 14 includes a plurality of first substrate connectors 15 and a plurality of first substrate conductive bumps 16. Those first substrate conductive bumps 16 may be deployed at the rim of the first glass substrate 10, while the first substrate connectors 15 may surround the first via hole 13.

The first glass substrate 10 may be a glass with conductive indium tin oxide (ITO) coating on the surfaces. The first substrate layout 14 thereon may be formed by any techniques including without limitation to etching. Further, the first substrate conductive bumps may be forms by, including without limitation to, wiring, electrolytic plating, electroless plating, bumps transferring, etc.

As showed in FIG. 1, the semiconductor device 100 further includes a first integrated chip 20 having a plurality of device conductive bumps 21 electrically connected to the first substrate connectors 15. There may also be a first anisotropic conductive film (not shown in FIG. 1) applied to the first device conductive bumps 21 and the first substrate connectors 15. The first anisotropic conductive film may flow into the first via hole 13.

Figure 4:
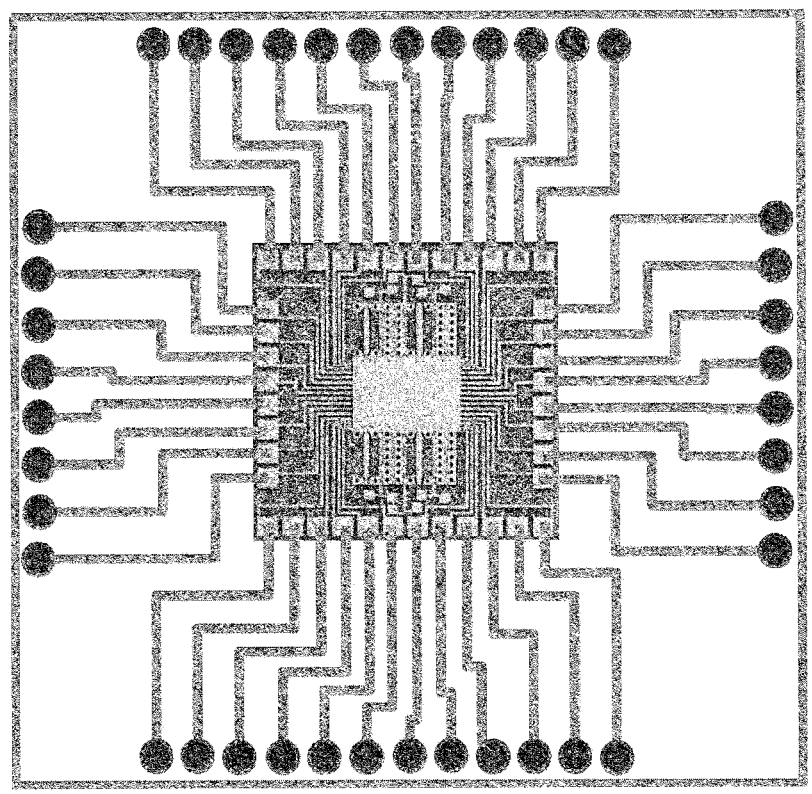
FIG. 4 illustrate a diagram where an integrated chip is bonded to a glass substrate in accordance with the present invention.

A technique called "chip-on-glass" (COG) is adopted to bond an integrated chip to a glass substrate through the use of anisotropic conductive films (ACF). Depending on the desired structures, various ACF with different particle sizes, compounds, densities, glue materials, etc. may be used. The density of conductive particles of the ACF provided for OCG is much higher than one provided for TCP (i.e. tape carrier package). The reason behind is in COG the connective bumps are connected to the glass substrate whilst in TCP it is the footprints that are connected. Thus, the contacting area (between the device and the substrate) in COG is much larger than that in TCP. ACF may be screen printed or gluing onto the substrate. It should be noted that ACF should not be diffused to bonding pads merely; it should be spread over the entire contacting surfaces of the substrate and the integrated chip. The integrated chip and the substrate are then heated and pressured to firmly bond to each other. As mentioned, the problem of COG is it cannot be reconstructed. Any dissembling of the integrated chip from a COG structure may damage the electrodes on the surfaces of the substrate and cause irreparable harm to the entire glass substrate. FIG. 4 shows a diagram where an integrated chip is bonded to a glass substrate in accordance with the present invention.

Figure 3:
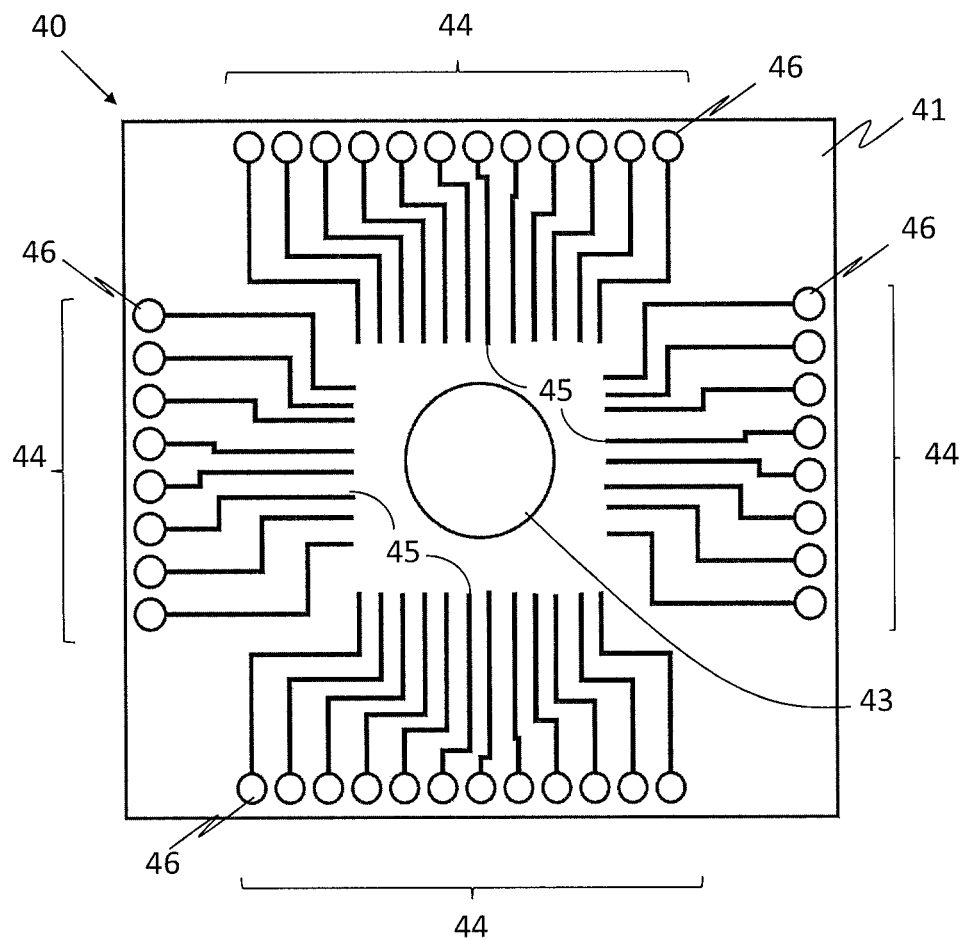
FIG. 3 shows a diagram of the second glass substrate of the semiconductor device in accordance with the present invention.

FIG. 3 shows a diagram of the second glass substrate of the semiconductor device. The semiconductor device 100 of the invention includes a second glass substrate 40 having a third surface 41, a forth surface 42, and a second via hole 43 passing through the third surface 41. The second via hole 43 is formed in the middle of the second glass substrate 40. Additionally, there is a second substrate layout 44 deployed on the third surface 41. The second substrate layout 44 includes a plurality of second substrate connectors 45 and a plurality of second substrate conductive bumps 46. Those second substrate conductive bumps 46 may be deployed at the rim of the second glass substrate 40, while the second substrate connectors 45 may surround the second via hole 43. Further, the semiconductor device may also include: a second integrated chip 50 having a plurality second device conductive bumps 51 electrically connected to the second substrate connectors 45, and a second anisotropic conductive film (not shown in FIG. 3) applied to the second device conductive bumps 51 and the second substrate connectors 18. The second anisotropic conductive film may flow into the second via hole 43.

The second glass substrate 40 is of the same characters of the first glass substrate 10; while the second substrate layout 44 is of the same characters of the first substrate layout 14. They will not be discussed in any further details in the specification. In one embodiment, there may be a metal coating layer for the sake of anti-interference (not shown in the diagrams) forming on the second surface 12 of the first glass substrate 10. Similarly, there may also be a metal coating layer for the sake of anti-interference (not shown in the diagrams) forming on the forth surface 42 of the second glass substrate 40. The presence of the metal coating layers is to avoid interference between integrated chips. Also similarly to the above discussion, the second integrated chip 50 is bonded to the second glass substrate 40 by way of COG. As mentioned, ACF should be spread over the entire adhesive surfaces of the substrate and the integrated chip. The integrated chip and the substrate are then heated and pressured to thinly bond to each other. Also as discussed, if ACF is evenly spread or bubbles are generated, these issues may result in a bumpy surface and cannot be fixed by reconstruction. In the present invention, while heating and pressuring to bond the integrated chip and the glass substrate, the residual ACF will flow into the via hole. The adoption of ACF and via hole together not only solves the above mentioned problem but also enhances the overall heat dissipation.

Also referring to FIG. 1, the semiconductor device 100 may further include a packaging body 70 having a first body surface 71 and a second body surface 72. The first body surface 71 may have a trench 711 and a main layout 712. The first integrated chip 20 and the first glass substrate 10 are disposed inside the trench 711, and electrically connected to the main layout 712 through the first substrate conductive bumps 51. Additionally, the second integrated chip 50 and the second glass substrate 40 are disposed above the first glass substrate 10, and are electrically connected to the main layout 712 through the second substrate conductive bumps 19.

The aforementioned first finished device where the first integrated chip 20 and the first glass substrate 10 are firmly bonded and the second finished device where the second integrated chip 50 and the second glass substrate 40 are firmly bonded are stacked and electronically connected to the packaging body 70. Such connections may be made by, including without limitation, using of solder bonding, anisotropic conductive film, or light-curing resin. The advantages of the present invention are well documented. First of all, the design of the stacked structure decreases the size and dimension of the package. Additionally, each of the integrated chips is boned to one glass substrate, by way of COG, where the layout is completed thereon. Therefore, it is not only much easier to ensure the distant consistence between the finished device and the main layout, but also solve the issue of timing non-synchronization and reduce the complexity of the layout design. It should be noted that the first integrated chip 20 and the second integrated chip 50 of the present invention are of the same functions and dimension. For instance, they can be CPUs, MCUs and/or ASICs. On the other hand, the dimensions of the first glass substrate 10 and the second glass substrate 40 are different; more precisely, the dimension of the second glass substrate 40 which is disposed above the first glass substrate 10 is larger.

Preferably, the trench 711 can be stepped and each of the steps may be connected to one integrated chip. Thus, the more steps, the more integrated chips can be stacked.

Preferably, the first body surface 71 may further include a plurality of solder balls 713 electronically connected to the main layout 712, and the second body surface 72 may include a plurality of heat sinks 721.

Preferably, the semiconductor device 100 may include a heat sink (not sown in the diagrams) deployed between the first glass substrate 10 and the second integrated chip 50 and connected to the packaging body 70 to enhance heat dissipation.

Preferably, the semiconductor device 100 may further include a bottom underfill (not shown in the diagrams) for filling with the gaps between the first glass substrate 10, the first integrated chip 20, the second glass substrate 40, the second integrated chip 50, and the packaging body 70 to strengthen the package.

Figure 5:
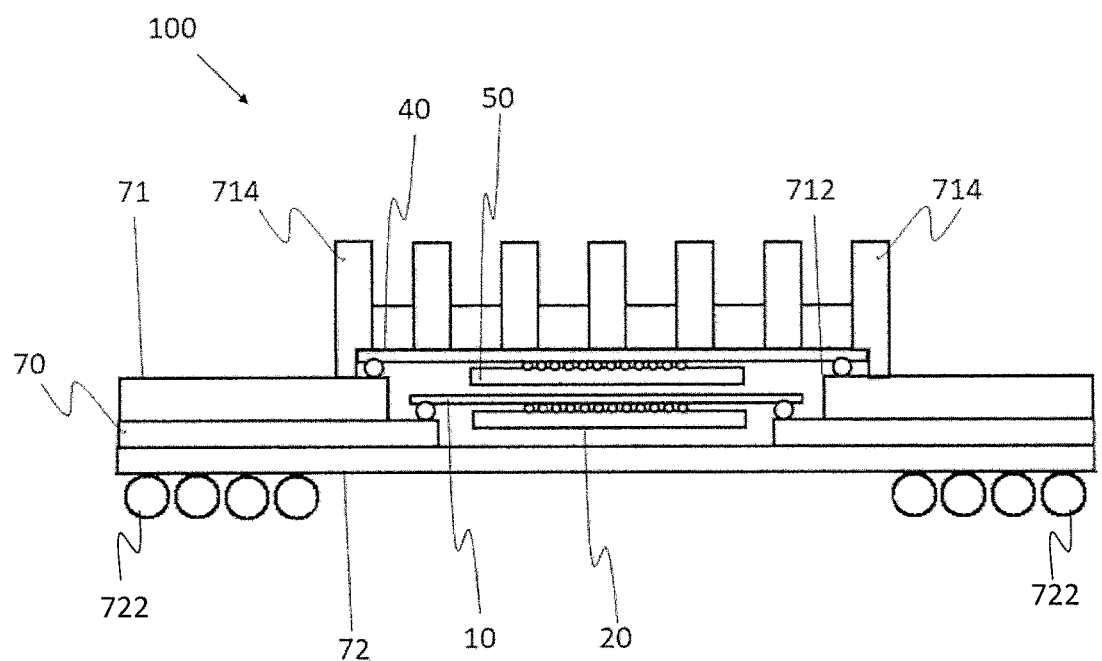
FIG. 5 illustrates a cross-section of a semiconductor device in accordance with the second embodiment of the present invention.

FIG. 5 illustrates a cross-section of the semiconductor device in accordance with the second embodiment of the present invention. As shown, the second body surface 72 includes a plurality of solder balls electronically connected to the main layout 712. Further, the first body surface 71 may include a plurality of heat sinks connected to the second glass substrate 40. The rest elements in the second embodiments are similar to those in the first embodiment.

Figure 6:
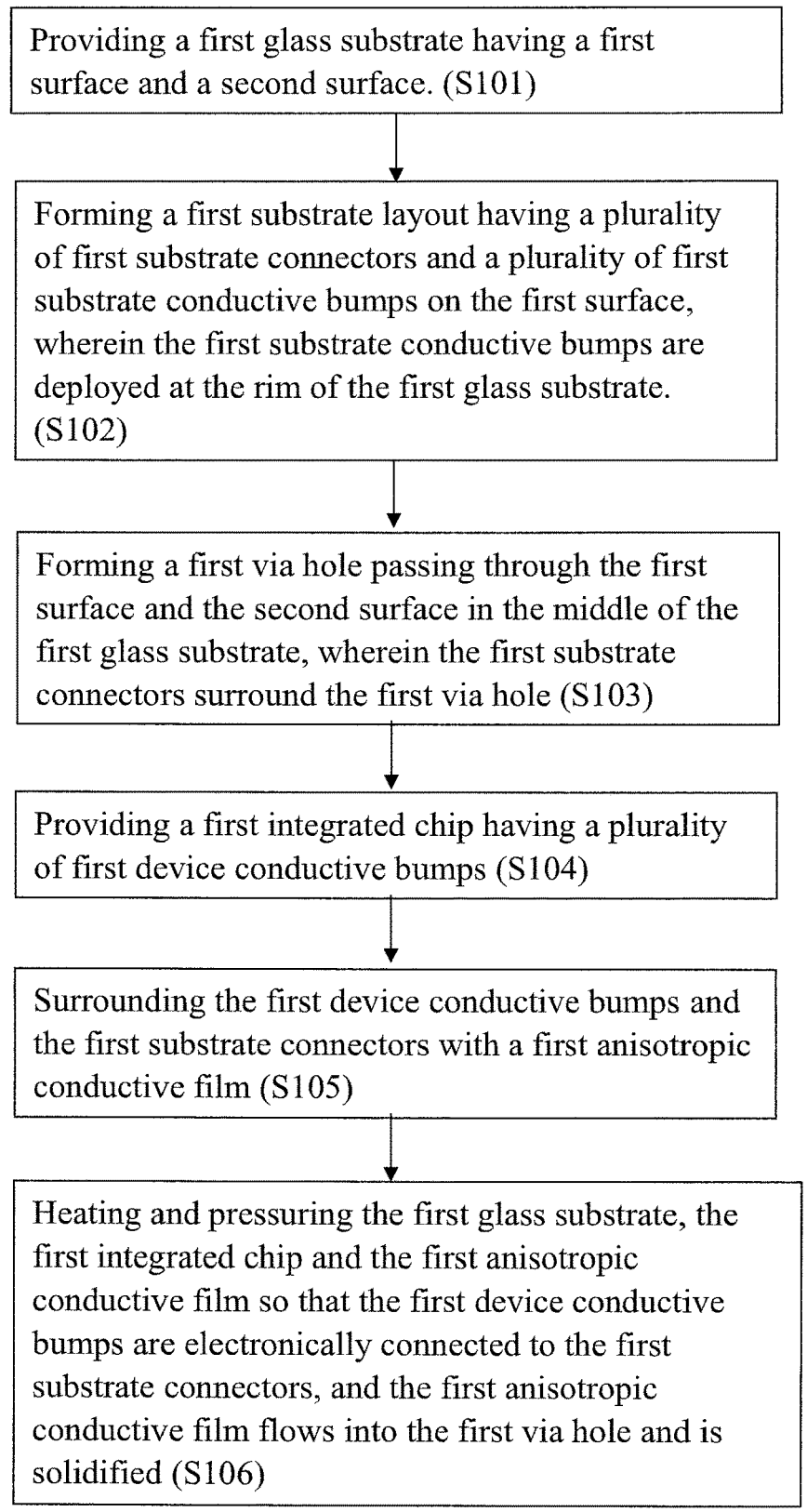
FIGS. 6 to 8 demonstrate the methods for manufacturing the semiconductor device of the present invention.
Figure 7:
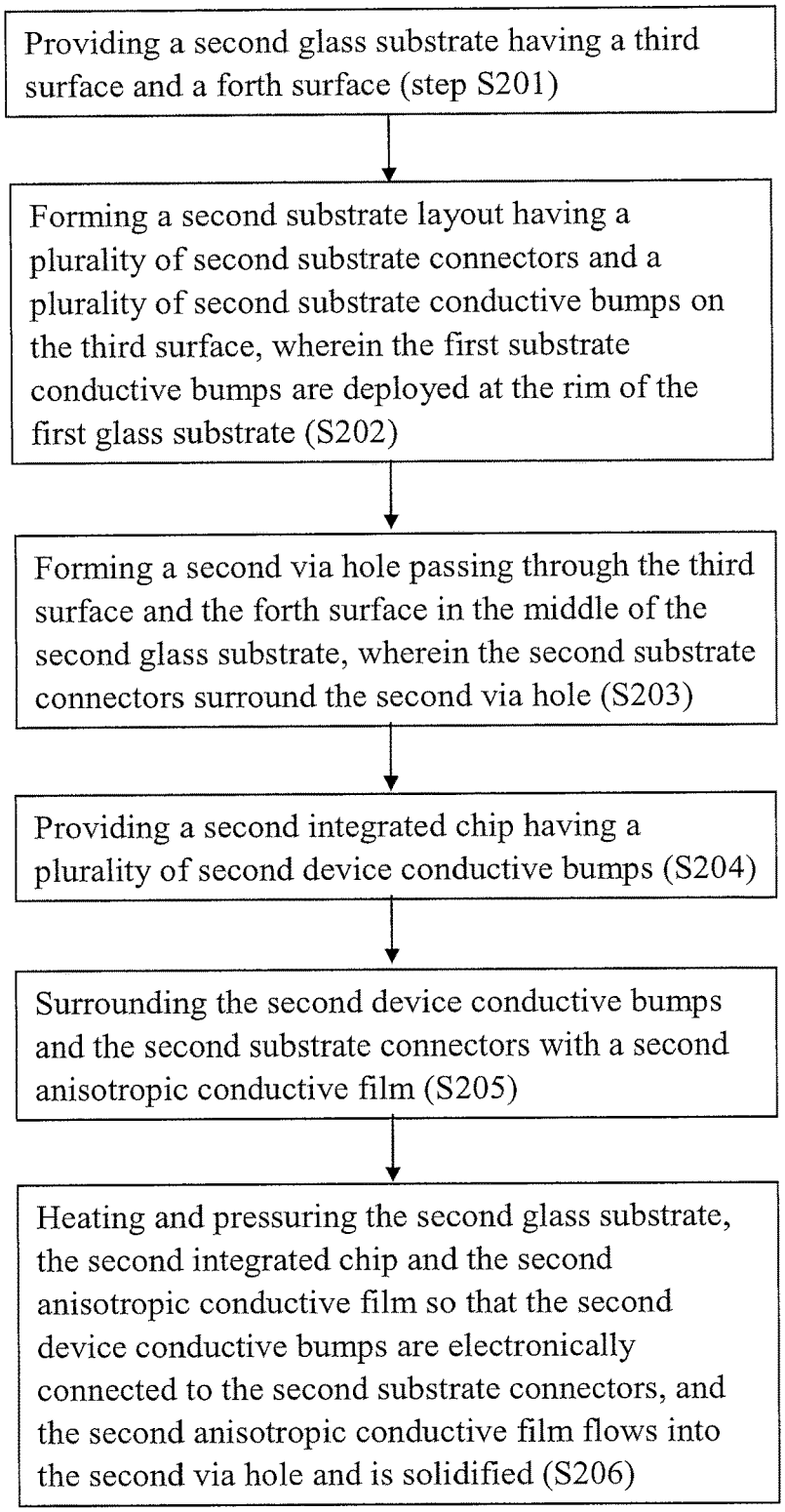
Figure 8:
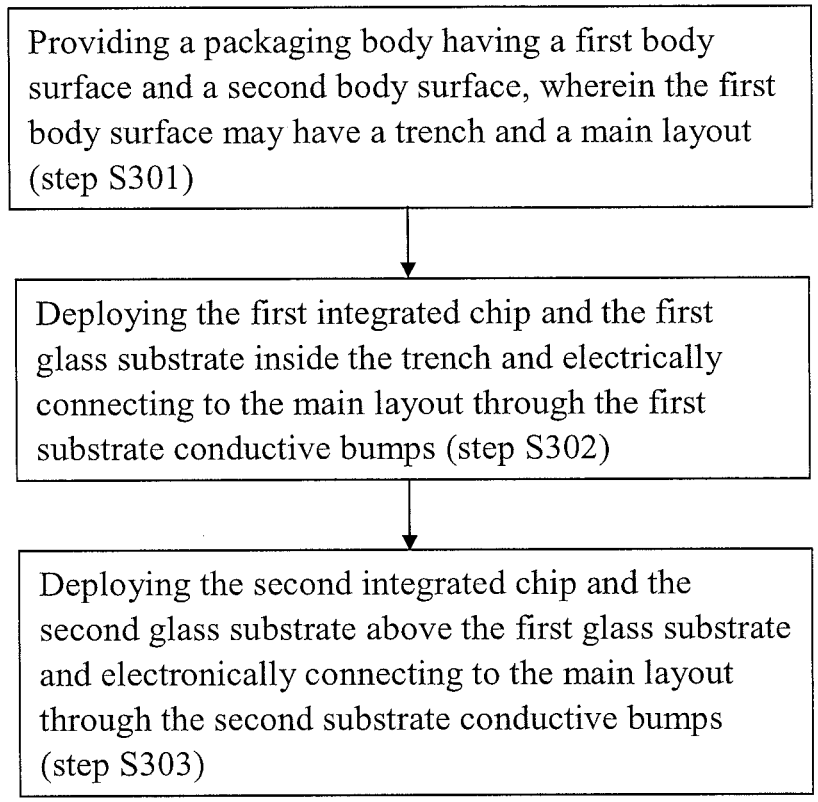

FIGS. 6 to 8 depict the method for manufacturing the semiconductor device of the present invention. The method, as shown in FIG. 6, includes: providing a first glass substrate having a first surface and a second surface (step S101); forming a first substrate layout having a plurality of first substrate connectors and a plurality of first substrate conductive bumps on the first surface, wherein the first substrate conductive bumps are deployed at the rim of the first glass substrate (step S102); forming a first via hole passing through the first surface and the second surface in the middle of the first glass substrate, wherein the first substrate connectors surround the first via hole (step S103); providing a first integrated chip having a plurality of first device conductive bumps (step S104); surrounding the first device conductive bumps and the first substrate connectors with a first anisotropic conductive film (step S105); heating and pressuring the first glass substrate, the first integrated chip and the first anisotropic conductive film so that the first device conductive bumps are electronically connected to the first substrate connectors, and the first anisotropic conductive film flows into the first via hole and is solidified (step S106).

Additionally, as depicted in FIG. 7, the method of the present invention further includes: providing a second glass substrate having a third surface and a forth surface (step S201); forming a second substrate layout having a plurality of second substrate connectors and a plurality of second substrate conductive bumps on the third surface, wherein the second substrate conductive bumps are deployed at the rim of the second glass substrate (step S202); forming a second via hole passing through the third surface and the forth surface in the middle of the second glass substrate, wherein the second substrate connectors surround the second via hole (step S203); providing a second integrated chip having a plurality of second device conductive bumps (step S204); surrounding the second device conductive bumps and the second substrate connectors with a second anisotropic conductive film (step S205); heating and pressuring the second glass substrate, the second integrated chip and the second anisotropic conductive film so that the second device conductive bumps are electronically connected to the second substrate connectors, and the second anisotropic conductive film flows into the second via hole and is solidified (step S206).

S101 to S103 and S201 to S203 disclosed above are the steps for preparing glass substrates. It should be noted that the glass substrate of the present invention may be a glass with conductive indium tin oxide (ITO) coating on the surfaces. The substrate layout thereon may be formed by any techniques including without limitation to etching. Further, the substrate conductive bumps may be forms by, including without limitation to, wiring, electrolytic plating, electroless plating, bumps transferring, etc. S104 and S204 are the steps for preparing the integrated chips. The device conductive bumps thereon may be forms by, including without limitation to, wiring, electrolytic plating, electroless plating, bumps transferring, etc. S105 and S205 are steps for applying anisotropic conductive films; while S106 and S206 are steps for bonding the glass substrate and the integrate chip by the anisotropic conductive film. According to the present invention, the integrated chip is bonded to the glass substrate, where the layout is furnished, by using anisotropic conductive films. Moreover, the presence of the via hole in the middle of the glass substrate not only avoids the occurrence of bumpy surfaces arising from unevenly spread anisotropic conductive film and bubbles, but also enhances the heat dissipation.

As demonstrated in FIG. 8, the method of the present invention may further include: providing a packaging body having a first body surface and a second body surface, wherein the first body surface may have a trench and a main layout (step S301); deploying the first integrated chip and the first glass substrate inside the trench and electrically connecting to the main layout through the first substrate conductive bumps (step S302); deploying the second integrated chip and the second glass substrate above the first glass substrate and electronically connecting to the main layout through the second substrate conductive bumps (step S303).

The present invention discloses a semiconductor device where the finished devices are stacked, and each of them is respectively connected to the packaging body by, including without limitation, using of solder bonding, anisotropic conductive film, or light-curing resin. Such structure can effectively and dramatically reduce the size and dimension of the package.

Preferably, after the first integrated chip and the first glass substrate are disposed in the trench, one may place a heat sink between the first glass substrate and the second integrated chip and contacting to the packaging body to dissipate the heat.

Preferably, after the second substrate conductive bumps are electrically connected to the main layout, one may apply an underfill for filling with the gaps between the first glass substrate, the first integrated chip, the second glass substrate, the second integrated chip, and the packaging body to strengthen the package.

The above-described embodiments of the invention are presented for purposes of illustration and not of limitation. Of course, those skilled in the art will recognize many modifications may be made to this configuration without departing from the scope of the disclosed aspects.

What is claimed is:

1. A semiconductor device, comprising:
a first glass substrate having a first surface, a second surface, and a first via hole formed in the middle of the first glass substrate and passing through the first surface and the second surface;
a first substrate layout formed on the first surface of the first glass substrate having a plurality of first substrate connectors and a plurality of first substrate conductive bumps, wherein the first substrate conductive bumps are deployed at the rim of the first glass substrate, and the first substrate connectors surround the first via hole;
a first integrated chip having a plurality of first device conductive bumps electrically connected to the first substrate connectors;
a first anisotropic conductive film (ACF) deployed around the first device conductive bumps and the first substrate connectors and flowing into the first via hole;
a second glass substrate having a third surface, a fourth surface, and a second via hole formed in the middle of the second glass substrate and passing through the third surface and the fourth surface;
a second substrate layout formed on the third surface having a plurality of second substrate connectors and a plurality of second substrate conductive bumps, wherein the second substrate conductive bumps are deployed at the rim of the second glass substrate, and the second substrate connectors surround the second via hole;
a second integrated chip having a plurality of second device conductive bumps electrically connected to the second substrate connectors;
a second anisotropic conductive film (ACF) deployed around the second device conductive bumps and the second substrate connectors and flowing into the second via hole; and
a packaging body having a first body surface and a second body surface; wherein the first body surface further comprises a trench and a main layout, wherein the first integrated chip and the first glass substrate are disposed inside the trench and electrically connected to the main layout through the first substrate conductive bumps, and wherein the second integrated chip and the second glass substrate are disposed above the first glass substrate and electrically connected to the main layout through the second substrate conductive bumps.

2. The semiconductor device of claim 1, wherein the first glass substrate further comprises a metal coating layer for anti-interference.

3. The semiconductor device of claim 1, wherein the second glass substrate further comprises a metal coating layer for anti-interference.

4. The semiconductor device of claim 1, wherein the first integrated chip and the second integrated chip are of the same function and dimension.

5. The semiconductor device of claim 1, wherein the trench is stepped.

6. The semiconductor device of claim 1, wherein the first body surface further comprises a plurality of solder balls electrically connecting to the main layout.

7. The semiconductor device of claim 6, wherein the second body surface further comprises a plurality of heat sinks.

8. The semiconductor device of claim 1, where the second body surface further comprises a plurality of solder balls electrically connecting to the main layout.

9. The semiconductor device of claim 8, wherein the first body surface further comprises a plurality of heat dissipaters coupled to the main layout.

10. A method for manufacturing a semiconductor device, comprising:
    providing a first glass substrate having a first surface and a second surface;
    forming a first substrate layout on the first surface, wherein the first substrate layout comprises a plurality of first substrate connectors and a plurality of first substrate conductive bumps deployed at the rim of the first glass substrate;
    forming a first via hole in the middle of the first glass substrate passing through the first surface and the second surface, wherein the first substrate connectors surround the first via hole;
    providing a first integrated chip having a plurality of first device conductive bumps;
    surrounding the first device conductive bumps and the first substrate connectors with a first anisotropic conductive film (ACF);
    heating and pressuring the first glass substrate, the first integrated chip and the first anisotropic conductive film so that the first device conductive bumps are electrically connected to the first substrate connectors, and the first anisotropic conductive film flows into the first via hole and is solidified;
    providing a second glass substrate having a third surface and a forth surface;
    forming a second substrate layout on the third surface, wherein the second substrate layout comprises a plurality of second substrate connectors and a plurality of second substrate conductive bumps deployed at the rim of the second glass substrate;
    forming a second via hole in the middle of the second glass substrate passing through the third surface and the forth surface, wherein the second substrate connectors surround the second via hole;
    providing a second integrated chip having a plurality of second device conductive bumps;
    surrounding the second device conductive bumps and the second substrate connectors with a second anisotropic conductive film;
    heating and pressuring the second glass substrate, the second integrated chip and the second anisotropic conductive film so that the second device conductive bumps are electrically connected to the second substrate connectors, and the second anisotropic conductive film flows into the second via hole and is solidified;
    providing a packaging body having a first body surface and a second body surface, and the first body surface further comprises a trench and a main layout;
    deploying the first integrated chip and the first glass substrate in the trench, and electrically connecting to the main layout through the first substrate conductive bumps; and
    deploying the second integrated chip and the first glass substrate above the first glass substrate, and electrically connecting to the main layout through the second substrate conductive bumps.

* * * * *